US008395907B2

(12) United States Patent
Marszalek et al.

(10) Patent No.: US 8,395,907 B2
(45) Date of Patent: Mar. 12, 2013

(54) MULTI-SENSOR ALARM APPARATUS, SYSTEM AND/OR METHOD FOR SECURING ARTICLES

(75) Inventors: Christopher Marszalek, Plainfield, IL (US); Jim Groth, Poplar Grove, IL (US); Daniel Horvath, Marseilles, IL (US); Andy Reynolds, Aurora, IL (US); Edward T. Eaton, Eola, IL (US); Kerry Berland, Chicago, IL (US); Try Ty, Chicago, IL (US); Mark Kmiecik, Chicago, IL (US)

(73) Assignee: SENNCO SOLUTIONS, Inc, Plainfield, IL (US)

( * ) Notice: Subject to any disclaimer, the term of this patent is extended or adjusted under 35 U.S.C. 154(b) by 756 days.

(21) Appl. No.: 12/455,096

(22) Filed: May 28, 2009

(65) Prior Publication Data

US 2010/0301998 A1 Dec. 2, 2010

(51) Int. Cl.
*H05K 7/02* (2006.01)
*H05K 7/04* (2006.01)

(52) U.S. Cl. ......................... 361/807; 361/725; 361/825

(58) Field of Classification Search .................. 361/807, 361/810, 800, 825, 829, 725; 340/5.65, 388, 340/815.45, 540, 541, 568.1, 571, 572.1, 340/572.8; 70/57.1; 235/439
See application file for complete search history.

(56) References Cited

U.S. PATENT DOCUMENTS

| | | | | |
|---|---|---|---|---|
| 5,861,807 | A | 1/1999 | Leyden et al. | |
| 6,027,277 | A | 2/2000 | Leyden et al. | |
| 7,053,774 | B2 * | 5/2006 | Sedon et al. | 340/568.2 |
| 7,154,039 | B1 | 12/2006 | Marszalek et al. | |
| 7,202,417 | B2 | 4/2007 | Marszalek et al. | |
| 7,202,786 | B2 | 4/2007 | Marszalek et al. | |
| 7,223,917 | B1 | 5/2007 | Marszalek et al. | |
| 7,385,522 | B2 | 6/2008 | Belden, Jr. et al. | |
| 7,387,003 | B2 | 6/2008 | Marszalek et al. | |
| 7,487,652 | B2 | 2/2009 | Marszalek et al. | |
| 7,504,944 | B2 | 3/2009 | Marszalek et al. | |
| 7,748,620 | B2 * | 7/2010 | Gomez et al. | 235/383 |
| 2005/0263315 | A1 | 12/2005 | Marszalek et al. | |
| 2005/0264418 | A1 | 12/2005 | Marszalek et al. | |
| 2005/0268674 | A1 | 12/2005 | Marszalek et al. | |
| 2006/0086160 | A1 | 4/2006 | Marszalek et al. | |
| 2006/0170549 | A1 | 8/2006 | Belden, Jr. et al. | |
| 2006/0174812 | A1 | 8/2006 | Marszalek et al. | |
| 2007/0113973 | A1 | 5/2007 | Marszalek et al. | |
| 2007/0125472 | A1 | 6/2007 | Marszalek et al. | |
| 2007/0125569 | A1 | 6/2007 | Marszalek et al. | |
| 2007/0152819 | A1 | 7/2007 | Marszalek et al. | |
| 2007/0169956 | A1 | 7/2007 | Marszalek et al. | |
| 2008/0061975 | A1 | 3/2008 | Belden, Jr. et al. | |
| 2008/0204239 | A1 | 8/2008 | Marszalek et al. | |
| 2009/0058643 | A1 | 3/2009 | Groth | |
| 2010/0073172 | A1 * | 3/2010 | Lax | 340/578 |
| 2012/0019383 | A1 * | 1/2012 | Fawcett et al. | 340/568.1 |

* cited by examiner

OTHER PUBLICATIONS

U.S. Appl. No. 12/455,096, Marszalek et al.

*Primary Examiner* — Hung S Bui
(74) *Attorney, Agent, or Firm* — Patents+TMS, P.C.

(57) ABSTRACT

A multi-sensor alarm apparatus, may prevent and/or may deter a theft and/or a removal of one or more articles from a display stand. A base, a main body and a head unit are provided. The base and the main body are secured to the display stand. The multi-sensor alarm apparatus monitors an integrity of the attachment of the main body to the base with a separation sensor. Further, the multi-sensor alarm apparatus monitors sensors connected to the head unit and/or to the main body. The sensors may be removed and/or added as needed depending on the articles to be secured.

9 Claims, 13 Drawing Sheets

MULTI-SENSOR ALARM APPARATUS, SYSTEM AND/OR METHOD FOR SECURING ARTICLES

BACKGROUND OF THE INVENTION

The present invention generally relates to a multi-sensor alarm apparatus, a system and/or a method for securing articles. More specifically, the present invention relates to a multi-sensor alarm apparatus, a system and/or a method that may prevent and/or deter a theft and/or a removal of one or more articles from a display stand. The alarm apparatus may have a base, a main body and/or a head unit. The alarm apparatus may monitor an integrity of the attachment of the main body to the base with a separation sensor. The head unit may be tethered to and/or in communication with the base and/or the main body with a primary tether cable that may communicate power and/or data to and/or from the head unit.

Further, the head unit may be affixed to a first article, such as, for example, a portable electronic device and may secure the first article to the display. The system may have a peripheral tether and/or a peripheral sensor that may secure a second article, such as, for example, a portable electronic device to the base and/or the main body. The first article and/or the second article may be on display and/or may be used, manipulated, tested and/or transported by consumers in an environment, such as, for example, a retail store.

It is generally known that retailers of a variety of articles use all-in-one security systems to secure samples of the articles to displays. The security systems are self-contained devices that monitor the security of a single article tethered thereto and sound an alarm if the security of the single article becomes compromised. Consumers interact with the samples at or near the displays. Pricing information and product availability may be placed on or near the display. Retailers use known security systems to maintain an availability of the samples and/or to control a location of the samples to allow consumers to have exposure to the articles. The security systems are provided in all-in-one configurations to allow for ease in installation, operation, repair and replacement. Moreover, if additional samples are later designated for display, additional security systems may be installed and configured to meet the needs of the retailers.

The samples exist in a variety of shapes and sizes and have a variety of display requirements. For example, some samples require only a single mechanical tether to attach the samples to the display. Some samples have additional fixed and/or removable parts that also require tethering to the display. Some samples require a seating orientation with respect to the display to maintain the sample in an upright or a level configuration for viewing by the consumers. Many samples require power connections and/or data connections to allow an operational interaction between the consumer and the samples. Many samples require proprietary plugs for power connections.

As a result, known security systems are provided and/or are used by retailers to tether a sample to its display and/or to alert security personnel of theft, destruction and/or tampering of the sample. Typically, the known security systems have non-redundant technology with a sensor to detect a single attachment of the sample to the tether. Additionally, known security systems monitor an integrity of the tether itself. Therefore, if the tether is cut, removed and/or tampered with, the security systems may sound an alarm. Further, known security systems provide power to the articles through power cables. Additionally, known security systems provide pedestals attached to the display that house components of the security systems. The pedestals are attached to the display to seat the samples away from the display and any advertisements of pricing information and/or the product information. The pedestals act to draw consumers' attention to the samples on display.

However, space for advertising pricing information and/or product information in a retail environment may be limited depending on the number of samples on display in a given area. Known security systems provide no means for advertising pricing information and/or availability information from the pedestal. Therefore, additional advertising space is required on the display to situate the pricing information and/or availability information.

Further, known security systems fail to provide redundant sensors to reduce the risk that a thief may defeat the security system. Known security systems fail to monitor an integrity of the power connection to the sample to ensure that the sample is in place and remains operational for interaction with consumers. Moreover, known security systems are difficult to adapt to samples that vary in shape and size, that have multiple and/or removable parts and/or that have proprietary power connections. Further, known security systems are designed to secure a single sample to the display. As a result, a variety of known security systems are required in a single retail store to secure the variety of samples on display. The known security systems fail to provide universal adaptability to a variety of samples and fail to secure more than one sample to the display in an all-in-one configuration.

A need, therefore, exists for a multi-sensor alarm apparatus, a system and/or a method for securing articles. Further, a need exists for a multi-sensor alarm apparatus, a system and/or a method for securing two or more articles in a self-contained, all-in-one configuration. Still further, a need exists for a multi-sensor alarm apparatus, a system and/or a method for securing articles that vary in shape, size and/or number of components to be secured. Still further, a need exists for a multi-sensor alarm apparatus, a system and/or a method for securing articles in a plurality of display configurations, including, but not limited to, varying a number and/or a type of mechanical tethers and/or electrical tethers, controlling seating orientations of the articles and/or varying a number and/or a type of power connections and/or data connections for the articles.

Still further, a need exists for a multi-sensor alarm apparatus, a system and/or a method for securing articles that provides a pedestal to seat the articles away from a display. Still further, a need exists for a multi-sensor alarm apparatus, a system and/or a method for securing articles that provides redundant sensors to reduce the risk of theft or compromise of the articles. Still further, a need exists for a multi-sensor alarm apparatus, a system and/or a method for securing articles that provide means for displaying pricing information and/or availability information. Still further, a need exists for a multi-sensor alarm apparatus, a system and/or a method for securing articles that monitors an integrity of the power connections to the articles to ensure that the sample is in place and remains operational for interaction with consumers. Moreover, a need exists for a multi-sensor alarm apparatus, a system and/or a method for securing articles that is easy to install, operate, repair and/or replace and that is universally adaptable to redundantly secure a wide variety of portable electronic devices.

SUMMARY OF THE INVENTION

The present invention generally relates to a multi-sensor alarm apparatus, a system and/or a method for securing articles. More specifically, the present invention relates to a multi-sensor alarm apparatus, a system and/or a method that may prevent and/or deter a theft and/or a removal of one or more articles from a display stand. The alarm apparatus may have a base, a main body and/or a head unit. The base may be attached to the main body. The base together with the main body may be secured to the display stand. The alarm apparatus may monitor an integrity of the attachment of the main body to the base with a separation sensor.

The head unit may be tethered to and/or in communication with the base and/or the main body with a primary tether cable that may communicate power and/or data to and/or from the head unit. Further, the head unit may be affixed to a first article, such as, for example, a portable electronic device and may secure the first article to the display. The head unit may have a plunger to detect a secure attachment of the head unit to the first article. The head unit may have a redundant auxiliary cable and/or a redundant auxiliary sensor that may be attached to the first article to detect a secure attachment of the first article to the head unit. The alarm apparatus may provide power to the first article by way of a charging cable between the first article and the head unit. The alarm apparatus may monitor an integrity of an electrical connection over the charging cable between the head unit and the first article. The first article together with the head unit may be seated for display on the main body of the alarm apparatus.

The system may have a peripheral tether and/or a peripheral sensor that may secure a second article, such as, for example, a portable electronic device to the base and/or the main body. The first article and/or the second article may be on display and/or may be used, manipulated, tested and/or transported by consumers in an environment, such as, for example, a retail store. The alarm apparatus may have an audible indicator and/or a visible indicator that may indicate an alarm mode.

The alarm apparatus may be programmed to arm and/or to monitor the integrity of any combination of the primary tether cable, the plunger, the auxiliary redundant cable, the auxiliary redundant sensor, the charging cable, the separation sensor, the peripheral tether cable and/or the peripheral sensor. The alarm apparatus may be powered by an external power source and/or by a battery within the main body. The battery may serve as a backup redundant power supply in the event the external power source fails and/or becomes disconnected.

To this end, in an embodiment of the present invention, an alarm apparatus for securing a plurality of articles to a display with a plurality of sensors wherein each of the plurality of sensors has a plug is provided. The alarm apparatus has a base having a front side and a back side wherein the back side is positioned opposite to the front side wherein the base has a first end and a second end wherein the second end is positioned opposite to the first end wherein the base has a bottom end in a position adjacent to the front side, the back side, the first end and the second end wherein the front side, the back side, the first end and the second end are integrally formed with the bottom end wherein the front side, the back side, the first end, the second end and the bottom end form a perimeter of the base. Further, the alarm apparatus has a fastening means on the bottom end of the base to attach the base to the display. Still further, the alarm apparatus has a main body having a front end and a back end wherein the back end is positioned opposite to the front end wherein the main body is sized to sit within the perimeter of the base to form an interior compartment wherein the interior compartment is defined by the front side of the base, the back side of the base, first end of the base, the second end of the base, the bottom end of the base and the main body wherein the main body fastens to the base. Still further, the alarm apparatus has a faceplate integrally formed on the front end of the main body wherein the faceplate forms a pedestal having a surface area sized to display one of the plurality of articles. Still further, the alarm apparatus has a key slot in the front end of the main body sized to provide access to the interior compartment. Still further, the alarm apparatus has a release lever extending from the base within the interior compartment wherein the release lever deflects to unlock the main body from the base. Moreover, the alarm apparatus has a plurality of jacks in the main body to receive the plugs wherein the plurality of jacks are accessed from the interior compartment wherein the base prevents removal of the plugs from the plurality of jacks.

In an embodiment, the alarm apparatus has a lens cover sized for attachment to the main body to cover the faceplate wherein the lens cover is transparent. Further, the alarm apparatus has an insert having indicia wherein the insert is sized for insertion between the lens cover and the faceplate.

In an embodiment, the alarm apparatus has a head unit sized to house one of the plurality of sensors wherein the head unit attaches to one of the plurality of articles wherein the head unit has a convex surface. Further, the alarm apparatus has a concave surface on the faceplate to receive the convex surface of the head unit.

In an embodiment, the alarm apparatus has a key sized for insertion into the key slot to release the main body from the base.

In an embodiment, the alarm apparatus has a power connection in the main body to provide power to the main body wherein the power connection is accessed from the interior compartment.

In an embodiment, the alarm apparatus has a battery within the main body wherein the battery powers the main body.

In an embodiment, the alarm apparatus has a plunger sensor extending from the main body wherein the plunger sensor detects an attachment of the main body to the base.

In an embodiment, the alarm apparatus has an LED visible from the main body to provide a visual indication of an alarm state.

In an embodiment, the alarm apparatus has a speaker within the main body to provide an audible indication of an alarm state.

In another embodiment, a system for redundantly monitoring an attachment of an article to a display stand wherein the article has a power jack to provide power to the article is provided. The system has an alarm housing that attaches to the display stand. Further, the system has a printed circuit board within the alarm housing. Still further, the system has a head unit in communication with the printed circuit board and the alarm housing wherein the head unit is sized to attach to the article. Still further, the system has a tether cable that electrically connects the head unit to the printed circuit board wherein the tether cable connects the head unit to the alarm housing. Still further, the system has a plunger extending from the head unit to detect an attachment of the head unit to the article wherein the printed circuit board is programmed to monitor an attachment of the head unit to the article with the plunger. Still further, the system has an electrical jack recessed into the head unit wherein the printed circuit board is programmed to provide power to the electrical jack. Moreover, the system has a charging cable having a first end and a second end wherein the second end is positioned opposite to the first end wherein the first end of the charging cable is connected to the electrical jack of the head unit wherein the second end of the charging cable is connected to the power jack of the article wherein the printed circuit board is programmed to monitor the electrical connection between the article and the head unit.

In an embodiment, the system has an auxiliary sensor jack recessed into the head unit wherein the auxiliary sensor jack is electrically connected to the printed circuit board. Further, the system has an auxiliary sensor connected to the auxiliary sensor jack wherein the auxiliary sensor attaches to the article wherein the printed circuit board is programmed to monitor an attachment of the auxiliary sensor to the article.

In an embodiment, the system has a key having a computer chip wherein the key inserts into the alarm housing.

In embodiment, the system has a button extending from the alarm housing wherein the printed circuit board is electrically connected to the button and further wherein the printed circuit board is programmed to accept an input from the button.

In an embodiment, the system has a sensor extending from the alarm housing wherein the sensor is electrically connected to the printed circuit board wherein the printed circuit board is programmed to detect an attachment of the alarm housing to the display stand.

In an embodiment, the system has an adhesive strip on the head unit to attach the head unit to the article.

In an embodiment, the system has an external power source electrically connected to the printed circuit board.

In another embodiment, a method for operating an alarm for securing articles to a display stand with a plurality of sensors wherein the alarm is configured to receive a first key and a second key wherein each of the first key and the second key has a computer chip having a unique serial identity wherein the alarm is programmed to recognize the serial identity of the chip of the first key wherein the alarm is not programmed to recognize the serial identity of the chip of the second key and further wherein the alarm has a button to train the alarm wherein the button is accessed from a surface of the alarm wherein the button is used to program the alarm is provided. The method has the step of inserting the first key into the alarm. Still further, the method has the step of installing the plurality of sensors between the articles and the alarm. Still further, the method has the step of depressing the button wherein the alarm detects the plurality of sensors. Moreover, the method has the step of removing the first key from the alarm wherein the alarm is activated to monitor the plurality of sensors.

In an embodiment, the method has the step of inserting the first key into the alarm to de-activate the alarm.

In an embodiment, the method has the step of inserting the second key into the alarm to program the alarm to recognize the second key.

In an embodiment, the method has the step of depressing the button. Further, the method has the step of inserting the second key into the alarm to program the alarm to recognize the second key.

It is, therefore, an advantage of the present invention to provide a multi-sensor alarm apparatus, a system and/or a method for securing articles.

Another advantage of the present invention is to provide a multi-sensor alarm apparatus, a system and/or a method for securing articles in a self-contained, all-in-one configuration.

And, another advantage of the present invention is to provide a multi-sensor alarm apparatus, a system and/or a method for securing articles that vary in shape, size and/or number of components to be secured.

Yet another advantage of the present invention is to provide a multi-sensor alarm apparatus, a system and/or a method for securing articles in a plurality of display configurations.

A further advantage of the present invention is to provide a multi-sensor alarm apparatus, a system and/or a method for securing articles that may allow a user to vary a number and/or a type of mechanical tethers and/or electrical tethers.

Moreover, an advantage of the present invention is to provide a multi-sensor alarm apparatus, a system and/or a method for securing articles that may allow a user to control seating orientations of the articles.

And, another advantage of the present invention is to provide a multi-sensor alarm apparatus, a system and/or a method for securing articles that may allow a user to vary a number and/or a type of power connections and/or data connections for the articles.

Yet another advantage of the present invention is to provide a multi-sensor alarm apparatus, a system and/or a method for securing articles that may have a pedestal to seat the articles.

Another advantage of the present invention is to provide a multi-sensor alarm apparatus, a system and/or a method for securing articles that may have a plurality of redundant sensors to reduce the risk of theft or compromise of the articles.

Yet another advantage of the present invention is to provide a multi-sensor alarm apparatus, a system and/or a method for securing articles that may have means for displaying pricing information and/or availability information.

A still further advantage of the present invention is to provide a multi-sensor alarm apparatus, a system and/or a method for securing articles that may monitor an integrity of the power connections to the articles to ensure that the articles are in place and/or remain operational for interaction with consumers.

Moreover, an advantage of the present invention is to provide a multi-sensor alarm apparatus, a system and/or a method for securing articles that may be easy to install, operate, repair and/or replace.

And, another advantage of the present invention is to provide a multi-sensor alarm apparatus, a system and/or a method for securing articles that may be universally adaptable to redundantly secure a wide variety of portable electronic devices.

Yet another advantage of the present invention is to provide a multi-sensor alarm apparatus, a system and/or a method for securing articles that may monitor an integrity of an attachment of a main body to a base with a separation sensor.

Moreover, an advantage of the present invention is to provide a multi-sensor alarm apparatus, a system and/or a method for securing articles that may have a peripheral tether and/or a peripheral sensor that may secure a second article, such as, for example, a portable electronic device to the base and/or the main body.

And, another advantage of the present invention is to provide a multi-sensor alarm apparatus, a system and/or a method for securing articles that may have a redundant auxiliary cable and/or a redundant auxiliary sensor that may be attached to a first article to detect a secure attachment of the first article to a head unit.

Yet another advantage of the present invention is to provide a multi-sensor alarm apparatus, a system and/or a method for securing articles that may monitor an integrity of an electrical connection over a charging cable between a head unit and a first article.

And, another advantage of the present invention is to provide a multi-sensor alarm apparatus, a system and/or a method for securing articles that may power cycle a battery of the articles to prolong an operating life of the battery.

Moreover, an advantage of the present invention is to provide a multi-sensor alarm apparatus, a system and/or a method for securing articles that may be programmed to arm any combination of the sensors that are desired to secure the articles.

Additional features and advantages of the present invention are described in, and will be apparent from, the detailed description of the presently preferred embodiments and from the drawings.

DETAILED DESCRIPTION OF THE PRESENTLY PREFERRED EMBODIMENTS

The present invention generally relates to a multi-sensor alarm apparatus, a system and/or a method for securing articles. More specifically, the present invention relates to a multi-sensor alarm apparatus, a system and/or a method that may prevent and/or deter a theft and/or a removal of one or more articles from a display stand.

Figure 1:
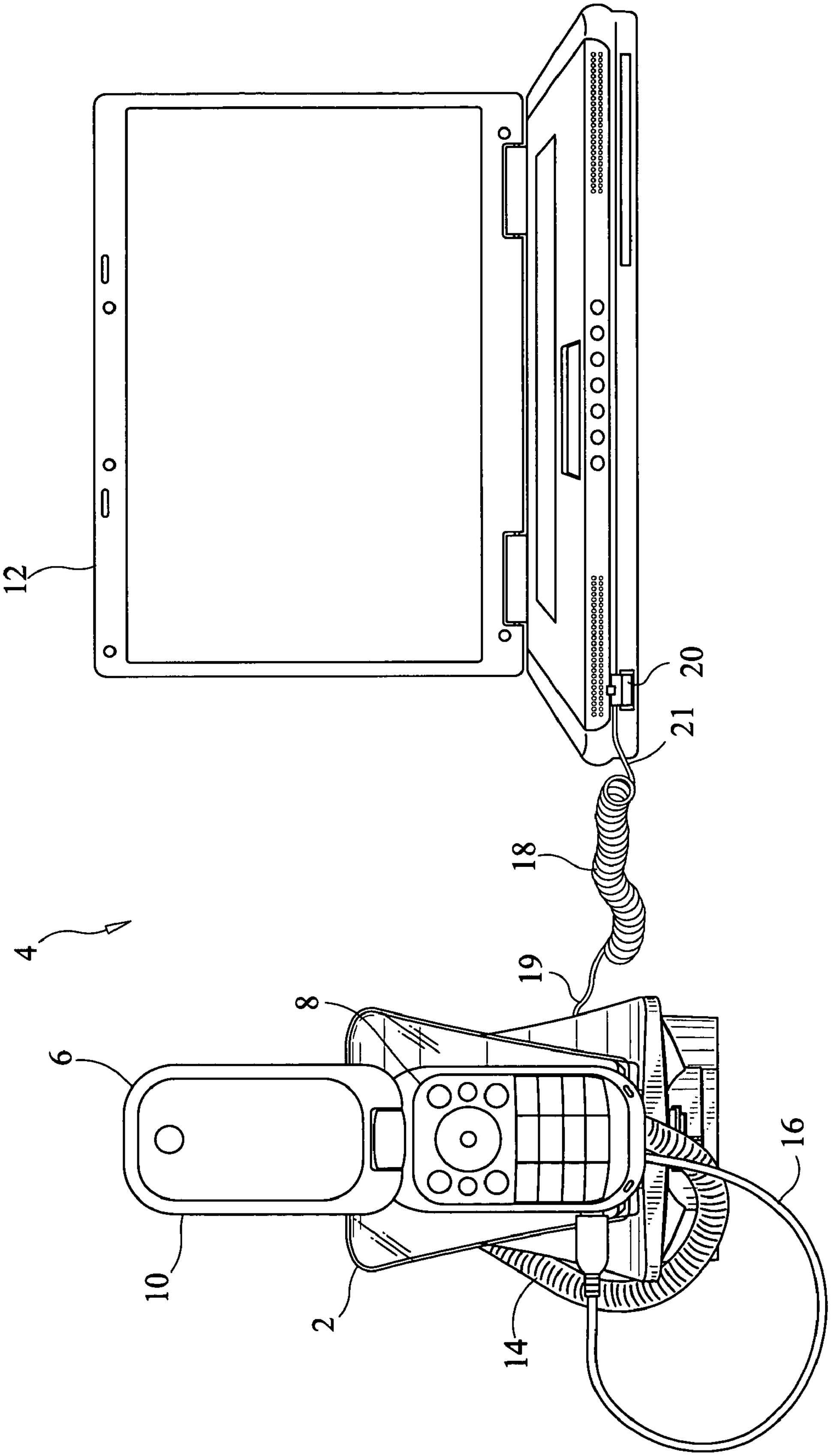
FIG. 1 illustrates a front plan view of a multi-sensor alarm apparatus and a system for securing articles in an embodiment of the present invention.
Figure 2:
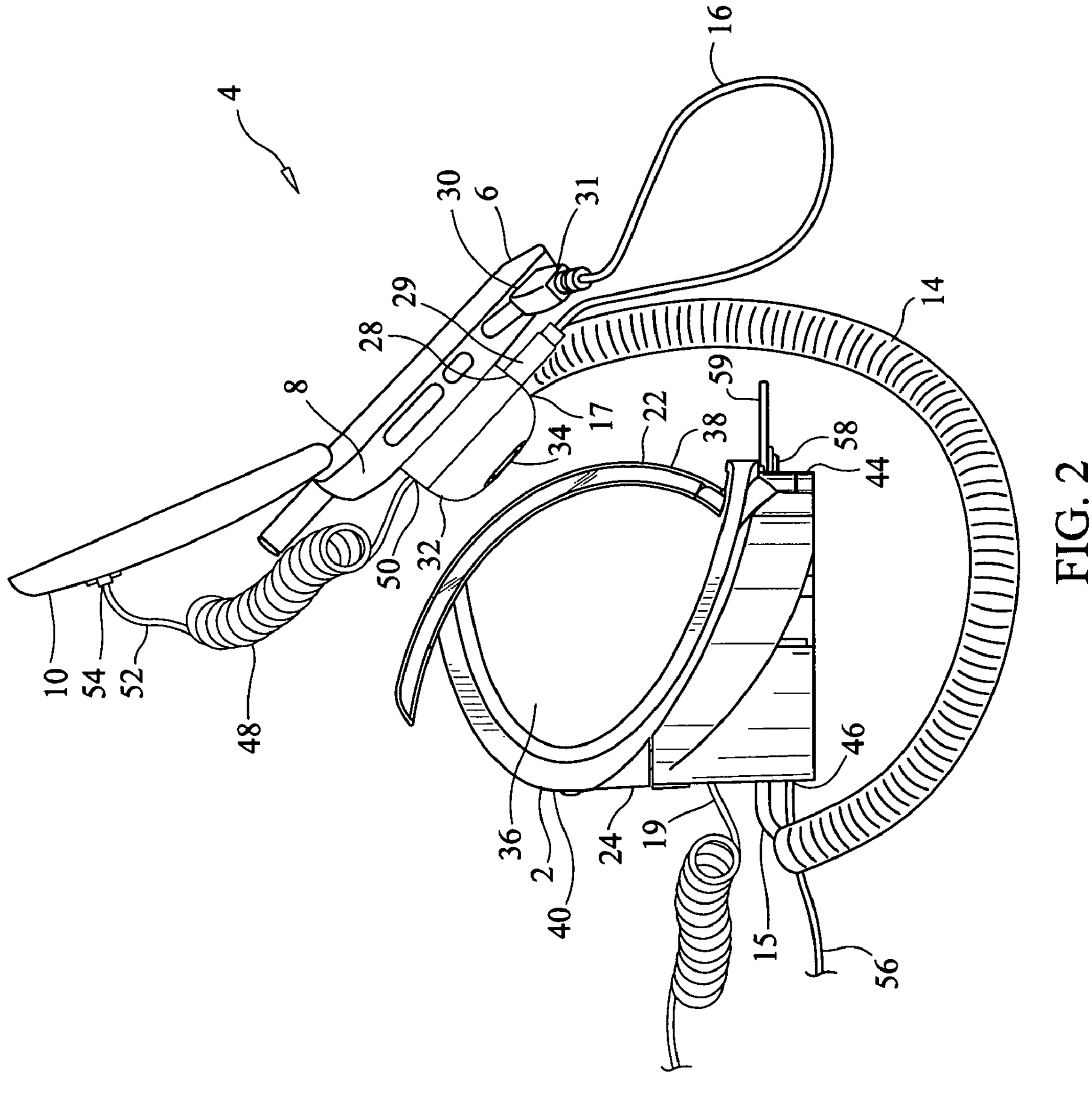
FIG. 2 illustrates a left-side plan view of a multi-sensor alarm apparatus and a system for securing articles in an embodiment of the present invention.

Referring now to the drawings wherein like numerals refer to like parts, FIGS. 1 and 2 illustrate a multi-sensor alarm apparatus 2 (hereinafter "the alarm apparatus 2") and/or a system 4 for securing articles 6, 12 in embodiments of the present invention. In an embodiment, each of the articles 6, 12 may be a portable electronic device, such as, for example, a cellular telephone, an mp3 player, a camera, a camcorder, a PDA, a gaming device, a handheld GPS system, a laptop computer, a satellite radio, a remote control, an e-book reader and/or the like. The articles 6, 12 may be on display and/or may be used, manipulated, tested and/or transported by consumers in an environment, such as, for example, a retail store. The present invention should not be deemed as limited to a specific embodiment of the articles 6, 12. In an alternative embodiment, the article 12 may be a display stand and/or other fixture on which the alarm apparatus 2 may be situated. In another embodiment, the article 6 may have a first portion 8 and a second portion 10, each of which may be secured by the present invention. It should be understood that the articles 6, 12 may be any articles sold and/or displayed in an environment offering any article, product and/or other merchandise as known to one having ordinary skill in the art.

As shown in FIG. 2, the alarm apparatus 2 and/or the system 4 may have a base 42, a main body 36 and/or a head unit 32. The base 42 may be attached to the main body 36. The base 42 together with the main body 36 may be secured to the display stand. The base 42, the main body 36 and/or the head unit 32 may be constructed from a material, such as, for example, a plastic, a thermoplastic, a silicone, a rubber, a metal and/or the like and/or any combination thereof. The base 42, the main body 36 and/or the head unit 32 may be constructed from any material for forming security devices as known to one having ordinary skill in the art.

As shown in FIG. 2, the alarm apparatus 2 may have a front side 22 and a back side 24 that may be positioned opposite to the front side 22. The main body 36 may have a front side 38 and a back side 40 that may be positioned opposite to the front side 38. The base 42 may have a front side 44 and a back side 46 that may be positioned opposite to the front side 44. The front side 38 of the main body 36 may have a faceplate 26 integrally formed thereto. In an alternative embodiment, the faceplate 26 may be attached to the front side 38 of the main body 36 with one or more fasteners (not shown). The faceplate 26 may receive the head unit 32 to seat the article 6 on the alarm apparatus 2. Further, the faceplate 26 may have a convex shape with respect to the main body 36.

Figure 3:
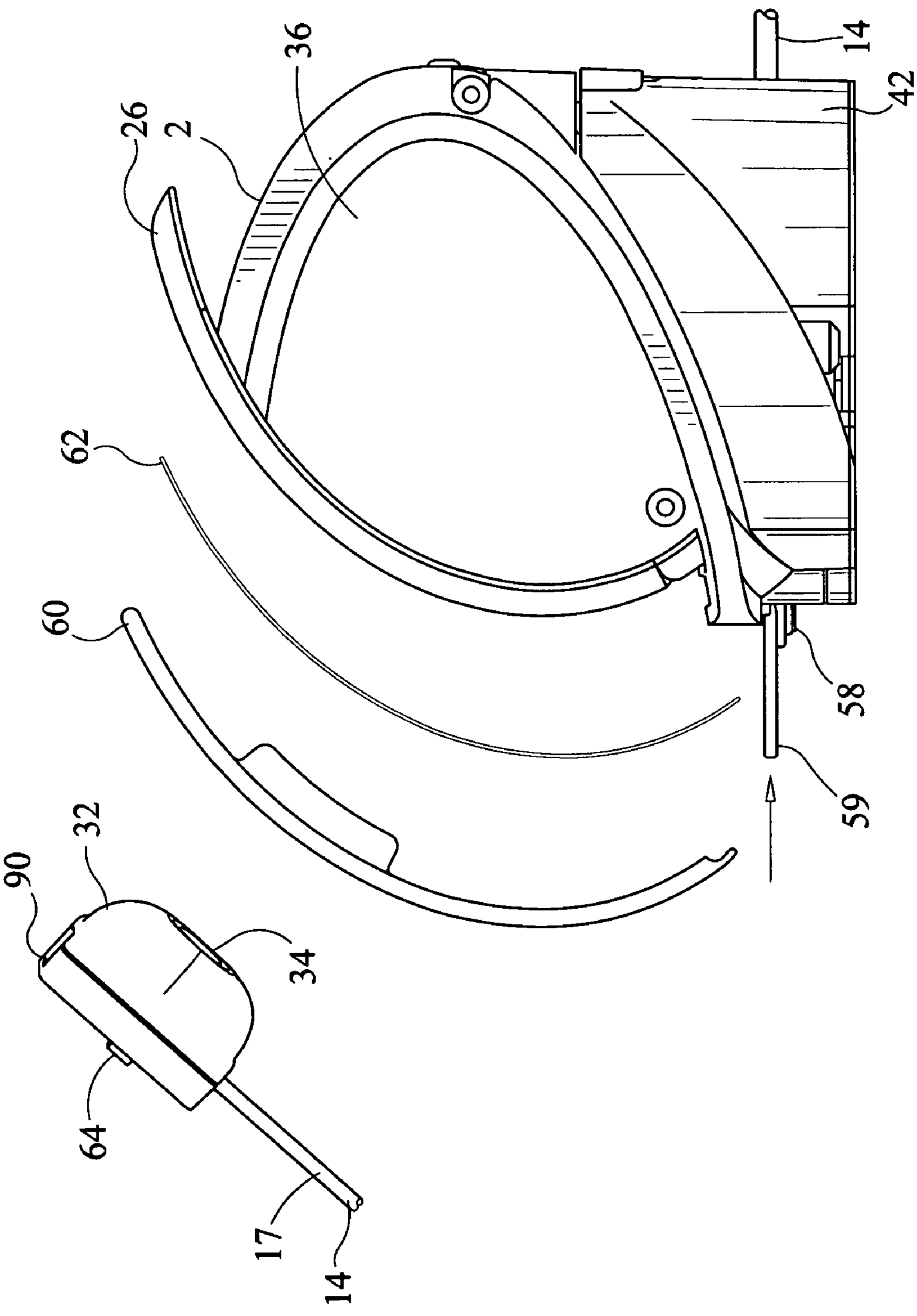
FIG. 3 illustrates a partial exploded right-side plan view of a multi-sensor alarm apparatus and a system for securing articles in an embodiment of the present invention.
Figure 6:
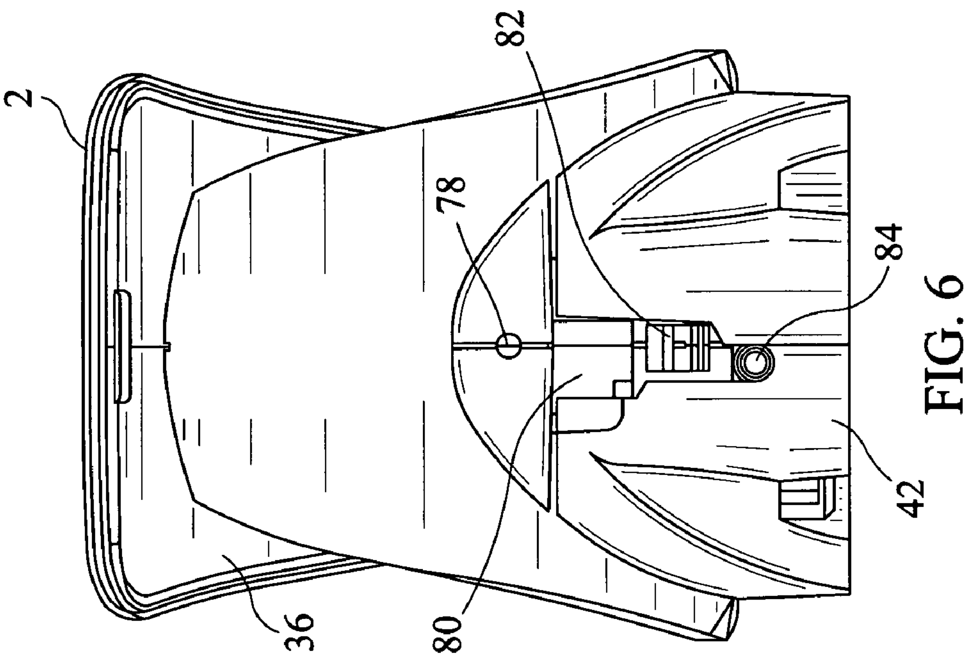
FIG. 6 illustrates a rear plan view of a multi-sensor alarm apparatus and a system for securing articles in an embodiment of the present invention.
Figure 5:
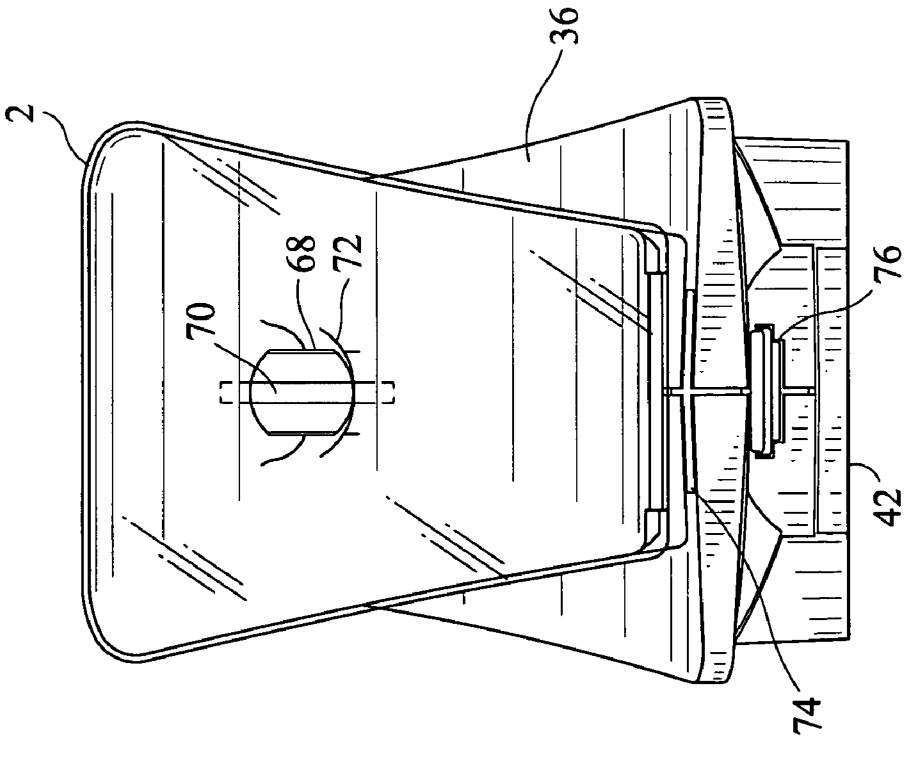
FIG. 5 illustrates a front plan view of a multi-sensor alarm apparatus and a system for securing articles in an embodiment of the present invention.
Figure 8:
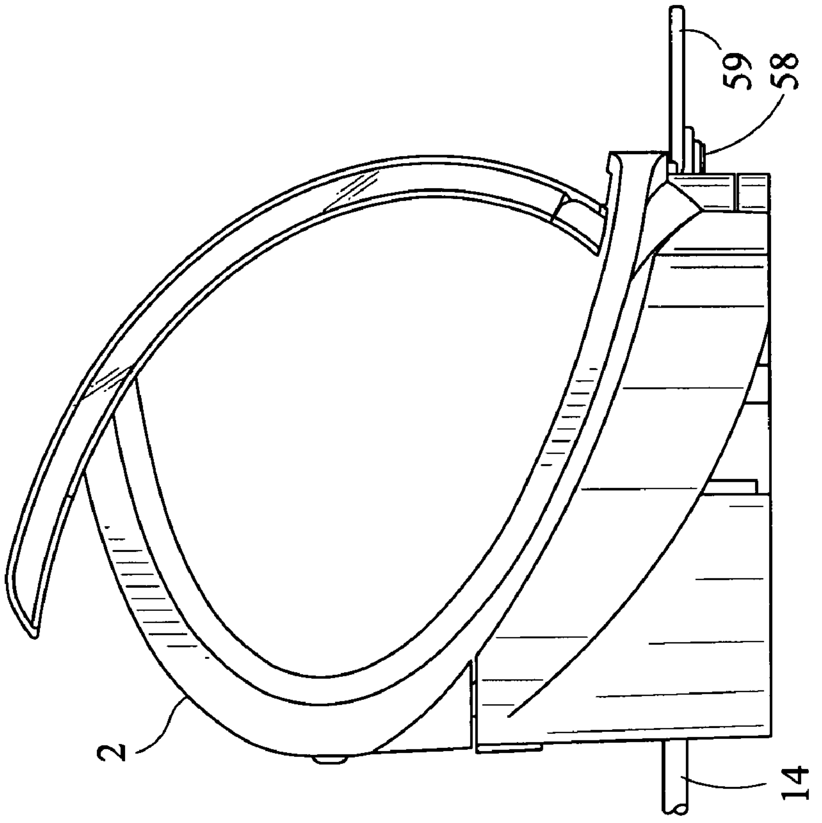
FIG. 8 illustrates a left-side plan view of a multi-sensor alarm apparatus and a system for securing articles in an embodiment of the present invention.
Figure 7:
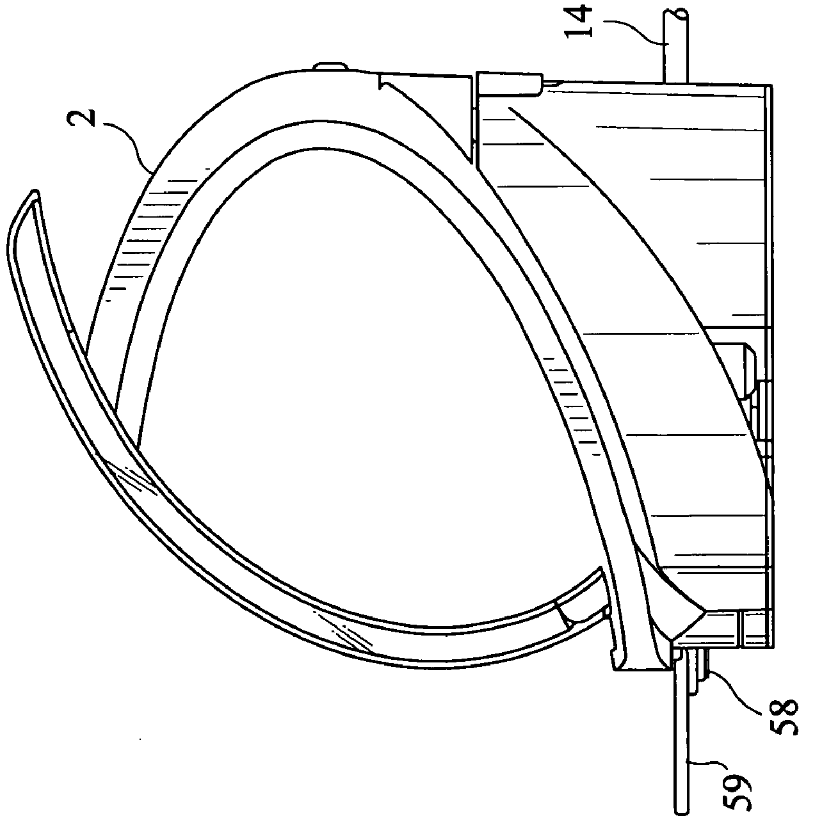
FIG. 7 illustrates a right-side plan view of a multi-sensor alarm apparatus and a system for securing articles in an embodiment of the present invention.

As shown in FIG. 2, the head unit 32 may be tethered to and/or in communication with the main body 36 with a primary tether cable 14 that may communicate power and/or data between the main body 36 and the head unit 32. The primary tether cable 14 may have a first end 15 and a second end 17 that may be situated in a position opposite to the first end 15. The first end 15 of the primary tether cable 14 may be connected to the main body 36 between the base 42 and the main body 36. The second end 17 of the primary tether cable 14 may be connected to the head unit 32, as shown in FIG. 3. The primary tether cable 14 may be pre-coiled to allow for extension and/or retraction while the article 6 and/or the head unit 32 are manipulated with respect to the main body 36. In an embodiment, the primary tether cable 14 together with the head unit 32 may be removed and may not be used with the system 4 to secure the article 6. The first end 15 of the primary tether cable 14 may have a network plug, such as, for example, an RJ-45 plug that may be received by a jack 80 that may be recessed in the main body 36 between the main body 36 and the base 42 as shown in FIG. 6. The present invention should not be deemed as limited to a specific embodiment of the primary tether cable 14 and/or the network plug. The primary tether cable 14 and/or the network plug may be any cable and/or plug that may be capable of mechanically securing the head unit 32 and/or of communicating power and/or data between the head unit 32 and the main body 36 as known to one having ordinary skill in the art.

Figure 12:
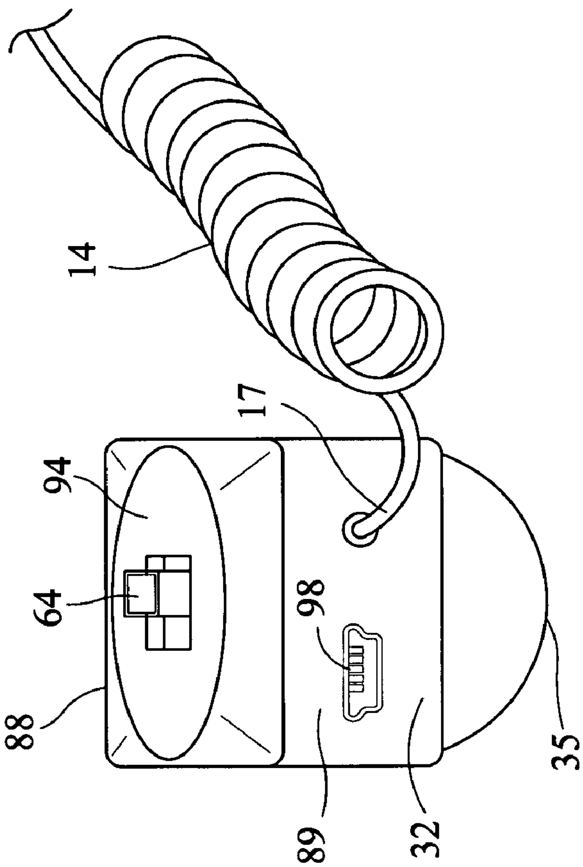
FIG. 12 illustrates a bottom view of a head unit of a multi-sensor alarm apparatus and a system for securing articles in an embodiment of the present invention.
Figure 11:
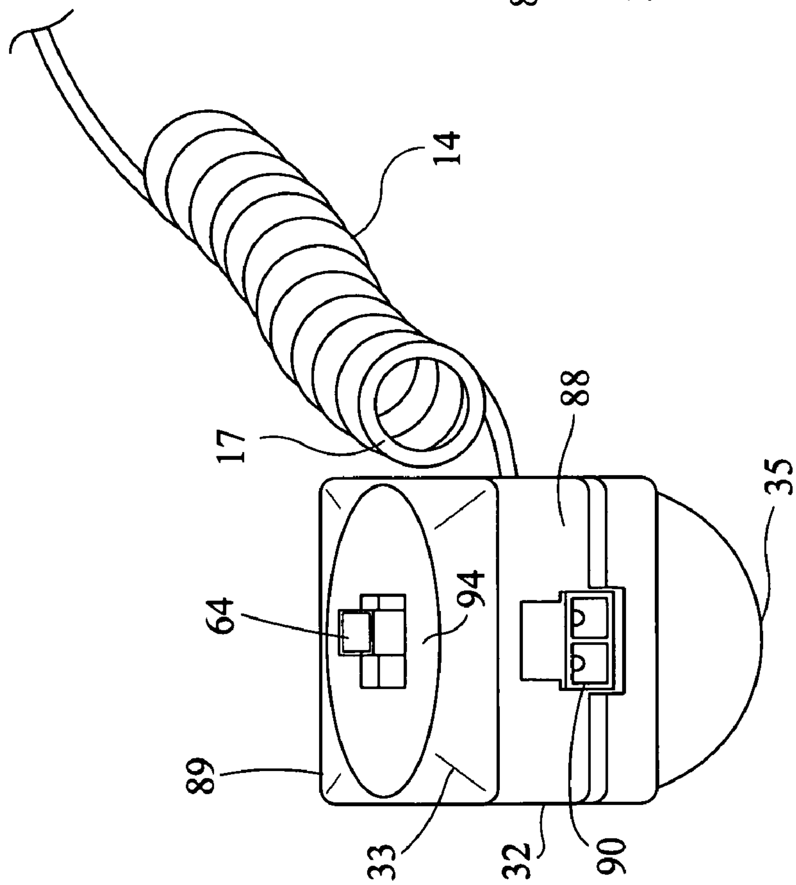
FIG. 11 illustrates a top view of a head unit of a multi-sensor alarm apparatus and a system for securing articles in an embodiment of the present invention.

As shown in FIGS. 11 and 12, the head unit 32 may have a top side 88 and a bottom side 89 that may be positioned opposite to the top side 88. The head unit 32 may have a front side 33 and a back side 35 that may be positioned opposite to the front side 33. The second end 17 of the primary tether cable 14 may pass through the bottom side 89 of the head unit 32 and may terminate within the head unit 32. The second end 17 of the primary tether cable 14 may be attached to and/or in communication with a printed circuit board 202 (hereinafter "the PCB 202") (See FIG. 16) that may be housed within the head unit 32. The front side 33 of the head unit 32 may have a plunger 64 that may be connected to and/or in communication with the PCB 202. The front side 33 of the head unit 32 may have, for example, an adhesive strip 94 that may attach the front side 33 of the head unit 32 to the article 6. The plunger 64 may be depressed by the article 6 when the head unit 32 is attached to the article 6. The plunger 64 may extend outward with respect to the front side 33 of the head unit when the article 6 is not attached to the front side 33 of the head unit 32 with the adhesive strip 94.

As shown in FIG. 11, the top side 88 of the head unit 32 may have a jack 90 that may be recessed into the head unit 32. The jack 90 may be in communication with the PCB 202. In an embodiment, as shown in FIG. 2, the system 4 may have a redundant auxiliary cable 48 that may have a first end 50 and a second end 52 that may be positioned opposite to the first end 50. The first end 50 of the redundant auxiliary cable 48 may have a network plug that may be connected to the jack 90 of the head unit 32. The second end 52 of the redundant auxiliary cable 48 may have a redundant auxiliary sensor 54 that may be attached to the second portion 10 of the article 6. The redundant auxiliary sensor 54 may detect secure attachment of the redundant auxiliary sensor 54 with a plunger system (not shown). The redundant auxiliary sensor 54 may have an LED (not shown) that may indicate a status of the redundant auxiliary sensor 54. The redundant auxiliary cable 48 may communicate power and/or data between the head unit 32 and the redundant auxiliary sensor 54.

In an embodiment, the redundant auxiliary cable 48 may be removable and may not be used with the system 4 to secure the second portion 10 of the article 6. The present invention should not be deemed as limited to a specific embodiment of the redundant auxiliary cable 48, the redundant auxiliary sensor 54 and/or the network plug. The redundant auxiliary cable 48, the redundant auxiliary sensor 54 and/or the network plug may be any cable, sensor and/or plug that may be capable of mechanically and/or electronically securing the second portion 10 of the article 6 to the head unit 32 as known to one having ordinary skill in the art.

As shown in FIG. 12, the bottom side 89 of the head unit 32 may have a recessed charging jack 98 that may be in communication with the PCB 202. In an embodiment, the recessed charging jack 98 may be configured to receive various power connectors, such as, for example, a USB Mini-A connector, a USB Mini-B connector, a USB Micro-A connector, a USB Micro-B connector, a USB Series A connector, a USB Series B connector and/or the like. The system 4 may have a charging cable 16 that may have a first end 28 and a second end 30 that may be positioned opposite to the first end 28. The first end 28 of the charging cable 16 may have a power connector 29, such as, for example, a USB Mini-A connector, a USB Mini-B connector, a USB Micro-A connector, a USB Micro-B connector, a USB Series A connector, a USB Series B connector and/or the like that may be inserted into the recessed charging jack 98 of the head unit 32. The second end 30 of the charging cable 16 may have a power connector 31 that may be suitable for insertion into a power port of the article 6. The system 4 may power and/or charge a battery (not shown) of the article 6 via the charging cable 16 between the head unit 32 and the article 6.

In an embodiment, the system 4, the PCB 202 and/or a PCB 200 (described herein below) may be programmed to power cycle the battery of the article 6 to prolong an operating life of the battery of the article. The system 4, the PCB 202 and/or the PCB 200 may be programmed to charge the battery of the article 6 over the charging cable 16 for a first length of time, such as, for example, for two hours. The first length of time during which the battery of the article 6 may be charged may be referred to as the charging phase below. After the battery of the article 6 has been charged for the first length of time, the system 4, the PCB 202 and/or the PCB 200 may be programmed to cease charging the battery of the article 6 for a second length of time, such as, for example, for one hour. The second length of time during which the battery of the article 6 may not be charged may be referred to as the non-charging phase. The system 4, the PCB 202 and/or the PCB 200 may be programmed to cycle the charging phase and/or the non-charging phase to prolong the operating life of the battery of the article 6 and/or to maintain the charge of battery of the article 6. The present invention should not be deemed as limited to a specific duration for the first length of time, the second length of time and/or cycling instructions programmed into the system 4, the PCB 202 and/or the PCB 200. The first length of time, the second length of time and/or the cycling instructions may be varied as needed and depending upon a type of the battery of the article 6 and/or a desire of a user of the system 4, the PCB 202 and/or the PCB 200. The first length of time of the charging phase, the second length of time of the non-charging phase and/or the cycling instructions may be any length of time and/or programming instructions as known to one having ordinary skill in the art.

The alarm apparatus 2 and/or the system 4 may detect an electrical connection between the head unit 32 and the article 6 via the charging cable 16. In an embodiment, the apparatus 2 and/or the system 4 may detect an electrical load over the charging cable 16 to determine if the charging cable 16 is connected between the head unit 32 and the article 6. In an embodiment, the apparatus 2 and/or the system 4 may detect the effect of a capacitor within the article 6 on a current of electricity flowing over the charging cable 16 to determine if the charging cable 16 is connected between the head unit 32 and the article 6. The present invention should not be deemed as limited to a specific embodiment of the recessed charging jack 98, the charging cable 16, the power connector 29, the power connector 31 and/or the method of detecting the electrical connection between the head unit 32 and the article 6. The recessed charging jack 98, the charging cable 16, the power connector 29, the power connector 31 and/or the method of detecting the electrical connection between the head unit 32 and the article 6 may be any jack, cable, power connector and/or method, respectively, as known to one having ordinary skill in the art.

As shown in FIGS. 1 and 2, the article 12 may be tethered to the main body 36 with a peripheral tether cable 18. The peripheral tether cable 18 may have a first end 19 and a second end 21 positioned opposite to the first end 19. The first end 19 may be connected to the main body 36 between the main body 36 and the base 42. The second end 21 of the peripheral tether cable 18 may have a peripheral sensor 20 that may be attached to the article 12. The peripheral sensor 20 may detect secure attachment of the peripheral sensor 20 with a plunger system (not shown). The peripheral sensor 20 may have an LED (not shown) that may indicate a status of the peripheral sensor 20. The peripheral tether cable 18 may communicate power and/or data between the main body 36 and the peripheral sensor 20. The peripheral tether cable 18 may be pre-coiled to allow for extension and/or retraction while the article 12 is manipulated with respect to the main body 36. In an embodiment, the peripheral tether cable 18 may be removable and may not be used with the system 4 to secure the article 12 to the alarm apparatus 2 and/or may not be used to secure the alarm apparatus 2 to the display stand. The first end 19 of the peripheral tether cable 18 may have a network plug, such as, for example, an RJ-45 plug that may be received by a jack 82 that may be recessed in the main body 36 between the main body 36 and the base 42. The present invention should not be deemed as limited to a specific embodiment of the peripheral tether cable 18, the peripheral sensor 20 and/or the network plug. The peripheral tether cable 18, the peripheral sensor 20 and/or the network plug may be any cable, sensor and/or plug that may be capable of mechanically and/or electronically securing the article 12 to the main body 36 as known to one having ordinary skill in the art.

As shown in FIG. 3, the back side 35 of the head unit 32 may be, for example, a rounded and/or convex surface. In an embodiment, the back side 35 of the head unit 32 may have, for example, an oval-shaped perimeter. The back side 35 of the head unit 32 may have a magnet 34. Correspondingly, the faceplate 26 of the alarm apparatus 2 may have a concave surface 68 that may be sized to receive the back side 35 of the head unit 32. Further, the concave surface 68 may have a corresponding oval-shaped perimeter. The faceplate 26 may have a bar 70 that may be situated adjacent to the concave surface 68. The bar 70 may be constructed from any ferromagnetic materials, such as, for example, iron, cobalt, nickel, alloys of the same and/or the like that may be attracted to permanent and/or temporary magnets. As a result, when the back side 35 is brought in near proximity to the concave surface 68 of the faceplate 26, the magnet 34 may attract the head unit 32 to the faceplate 26. A magnetic force may be created by the attraction between the magnet 34 and the bar 70 and may be strong enough to hold the head unit 32 and the article 6 in place on the alarm apparatus 2. In an embodiment, the corresponding oval-shaped perimeters of the back side 35 of the head unit 32 and the concave surface 68 of the face plate 26 along with the attraction between the magnet 34 and the bar 70 may cause the head unit 32 to be rotated into a first orientation or a second orientation with respect to the face plate 26 when seated. The first orientation may be one hundred eighty (180) degrees from the second orientation.

Figure 4:
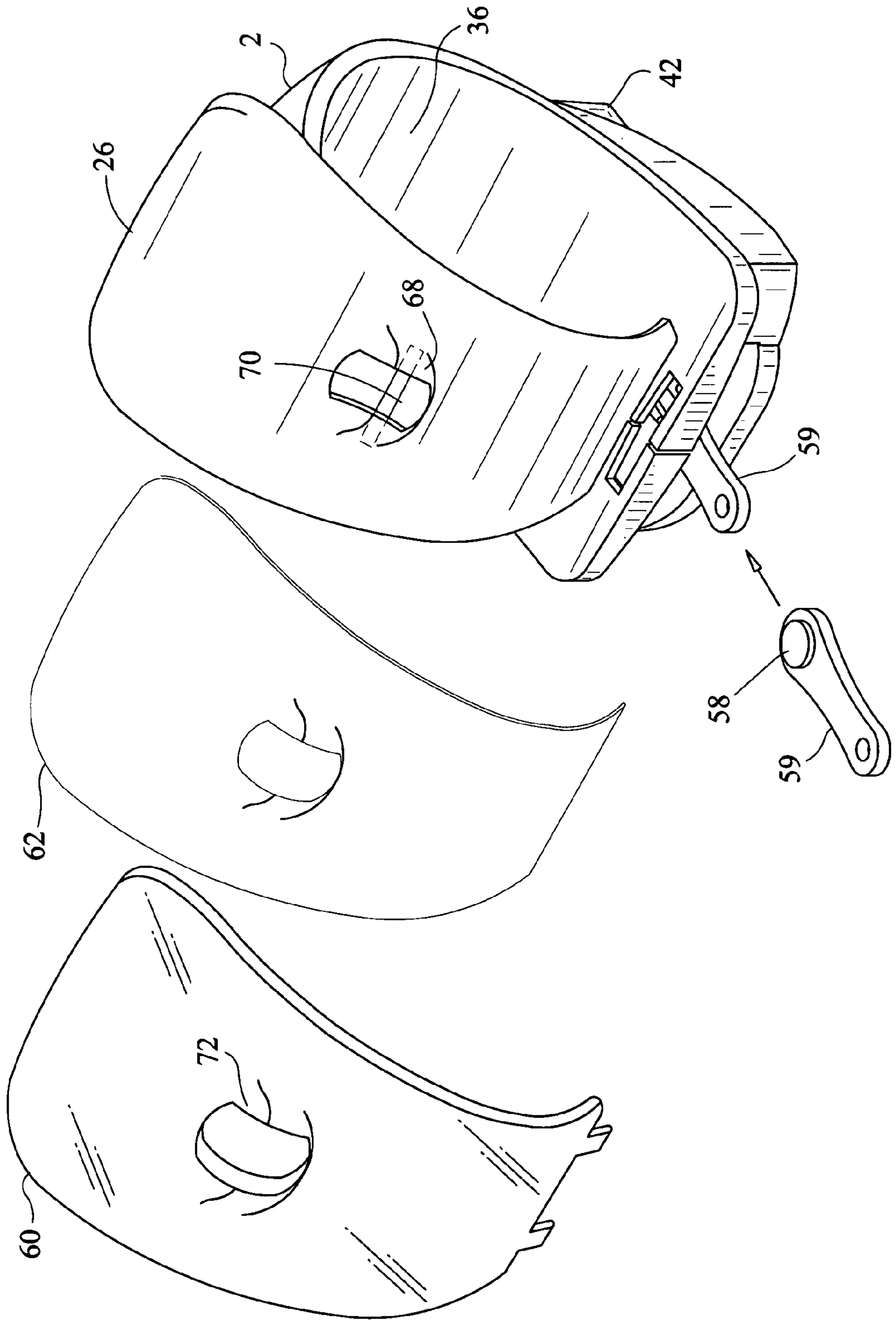
FIG. 4 illustrates a perspective view of a multi-sensor alarm apparatus and a system for securing articles in an embodiment of the present invention.

As shown in FIGS. 3 and 4, the alarm apparatus 2 may have a lens cover 60 that may be sized to fit over the faceplate 26. The lens cover 60 may be transparent, translucent and/or opaque. In a preferred embodiment, the lense cover 60 may be constructed from plastic and may be transparent. The alarm apparatus 2 may have an insert 62 that may placed between the lens cover 60 and the faceplate 26. In an embodiment, the insert 62 may have a shape that corresponds with a shape of the faceplate 26 and the lens cover 60. The insert 62 may have indicia, such as, for example, pricing information and/or availability information related to the articles 6, 12. The insert 62 may be constructed from a material, such as, for example, a paper, a plastic and/or the like. Further, the insert 62 may be any one or more of a variety of colors to match a decor and/or an environment in which the alarm apparatus 2 may be located. The lens cover 60 may have a concave surface 72 that may correspond to the concave surface 68 of the faceplate 26 to allow the head unit 32 to be seated in close proximity to the bar 70 of the faceplate 26. After the article 6 and head unit 32 are removed from a seated position on the lens cover 60 and the faceplate 26, the indicia and/or the color on the insert 62 may be more visible through the lens cover 60. The present invention should not be deemed as limited to a specific embodiment of the insert 62. The insert 62 may be any size shape and/or material and/or may have any indicia and/or colors that may be visible through the lens cover 60 as known to one having ordinary skill in the art.

Figure 10:
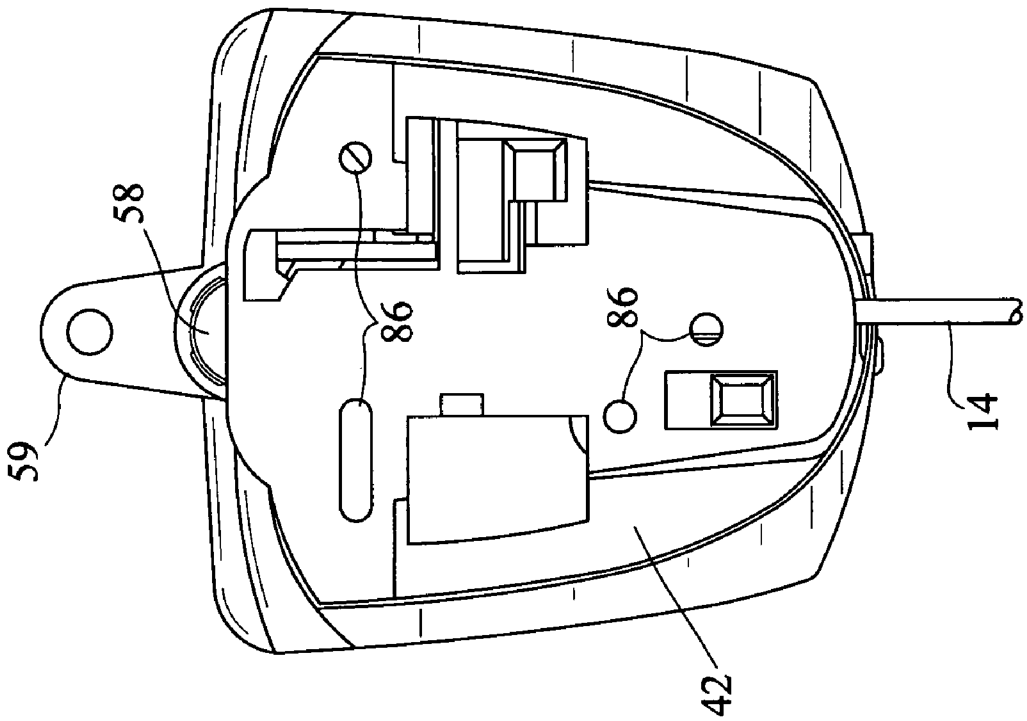
FIG. 10 illustrates a bottom plan view of a multi-sensor alarm apparatus and a system for securing articles in an embodiment of the present invention.
Figure 9:
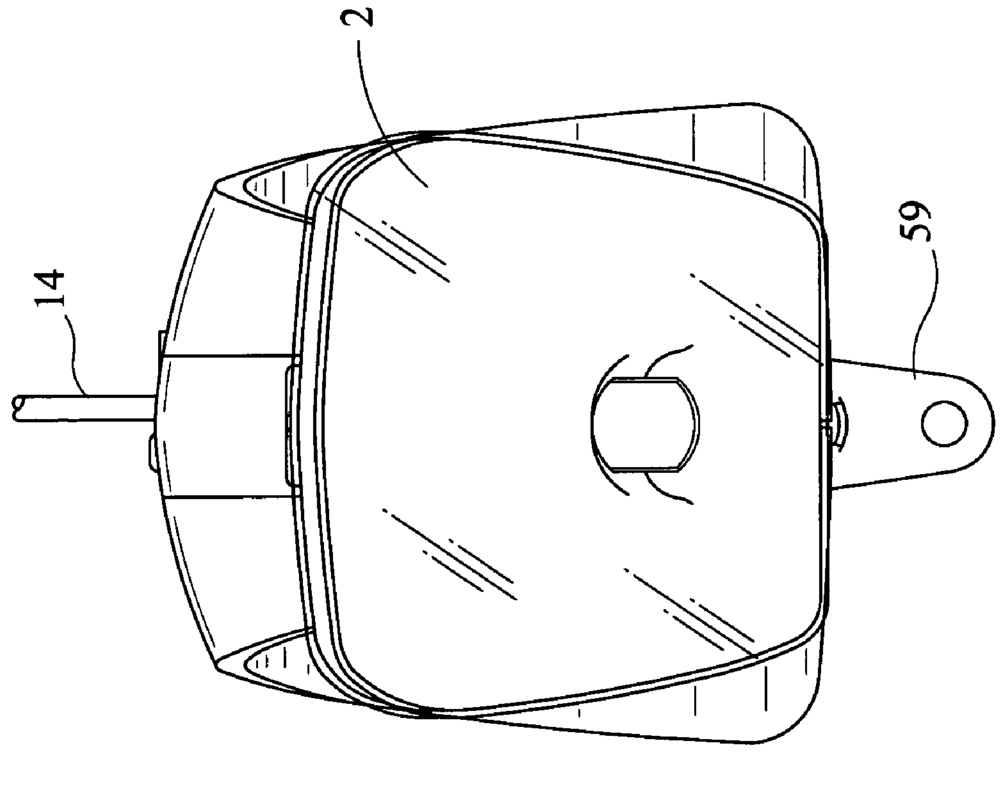
FIG. 9 illustrates a top plan view of a multi-sensor alarm apparatus and a system for securing articles in an embodiment of the present invention.
Figure 14:
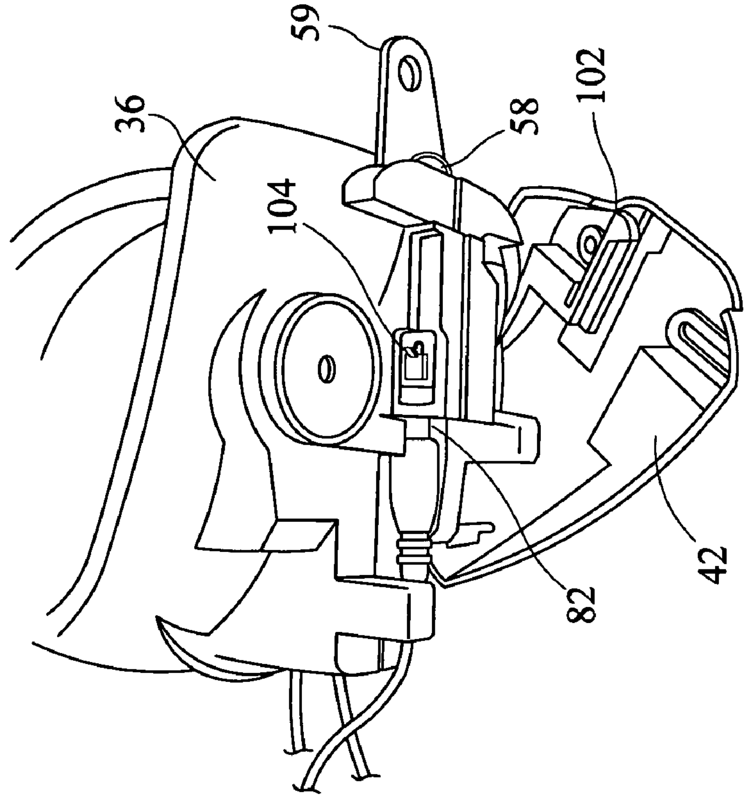
FIG. 14 illustrates a perspective view of a main body of a multi-sensor alarm apparatus and a system for securing articles in an embodiment of the present invention.
Figure 13:
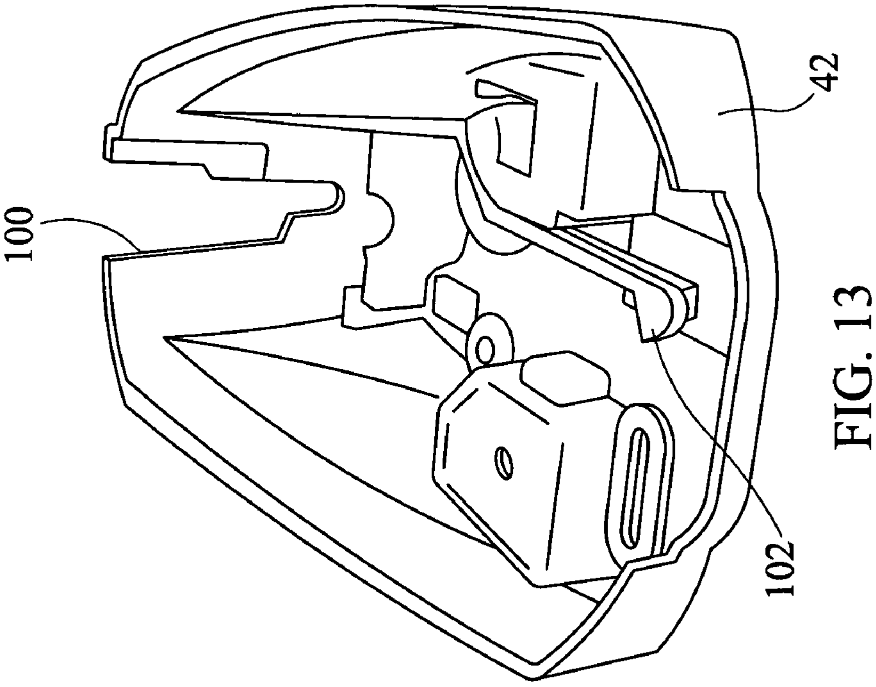
FIG. 13 illustrates a perspective view of a base of a multi-sensor alarm apparatus and a system for securing articles in an embodiment of the present invention.
Figure 15:
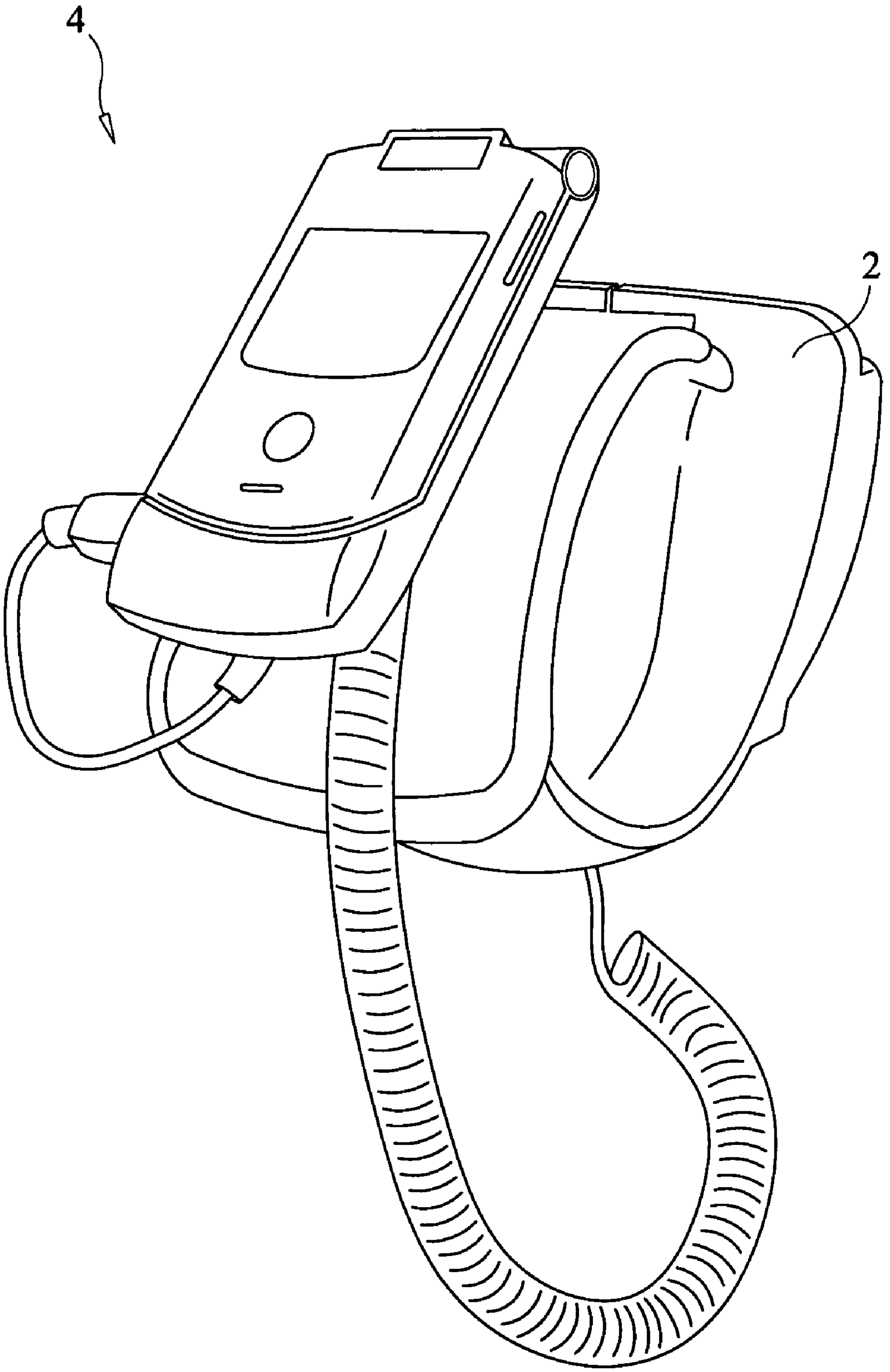
FIG. 15 illustrates a perspective view of a wall-mounted multi-sensor alarm apparatus and a system for securing articles in an embodiment of the present invention.

Referring now to FIGS. 10 and 13, the base 42 may have a front side 44 and a back side 46 that may be positioned opposite to the front side 44. The base 44 may have a plurality of fastener holes 86 to attach the base 44 to the display with fasteners (not shown). In an embodiment, as shown in FIG. 15, the base 42 may be fastened to a surface that may situate the alarm apparatus 2 and/or the system 4 in a wall-mounted configuration. The base 44 may be sized and shaped to receive the main body 36. The main body 36 may be placed onto the base 44 and/or may become locked thereto. The main body 36 may have a key slot 76 on the front side 38 of the main body 36 that may be situated in close proximity to the front side 44 of the base 42. The base 42 may have a release leaver 102 that may be located within the alarm apparatus 2 on the base 42 between the base 42 and the main body 36 and adjacent to the key slot 76. A key 58 may be inserted into the key slot 76 that may deflect the release leaver 102 and may allow the main body 36 to be removed from the base 42. In an embodiment, as shown in FIG. 14, the main body 36 may have a separation sensor 104. The separation sensor 104 may be, for example, a plunger circuit that may be depressed by a portion of the base 42 when the main body 36 is seated within the base 42. When the main body 36 is removed from the base 42, the separation sensor 104 may be separated from the portion of the base and an alarm state may be entered.

The base 42 may have a cutout 100 on the back side 46 of the base 42. The cutout 100 may be sized to allow the power cable 56, the primary tether cable 14 and/or the peripheral tether cable 18 to pass through the base 42 for attachment to the main body 36 between the main body 36 and the base 42. The cutout 100 may be sized to prevent removal of the power cable 56, the primary tether cable 14 and/or the peripheral tether cable 18 from the main body 36 while the main body 36 is seated within the base 42. In an embodiment, the cutout 100 may be sized to prevent removal of the network plugs of the primary tether cable 14 and/or the peripheral tether cable 18, respectively, from the main body 36 while the main body 36 is seated within the base 42. The cutout 100 may be sized to prevent removal of the power cable 56 from the main body 36. A size and/or a shape of the cutout 100 may prevent tampering with the network plugs and the power cable 56 while the main body 36 is attached to the base 42. However, when the main body 36 is separated from the base 42, the network plugs of the primary tether cable 14 and/or the peripheral tether cable 18 and/or a plug of the power cable 56 may be removed from and/or inserted into the main body 36.

Figure 16:
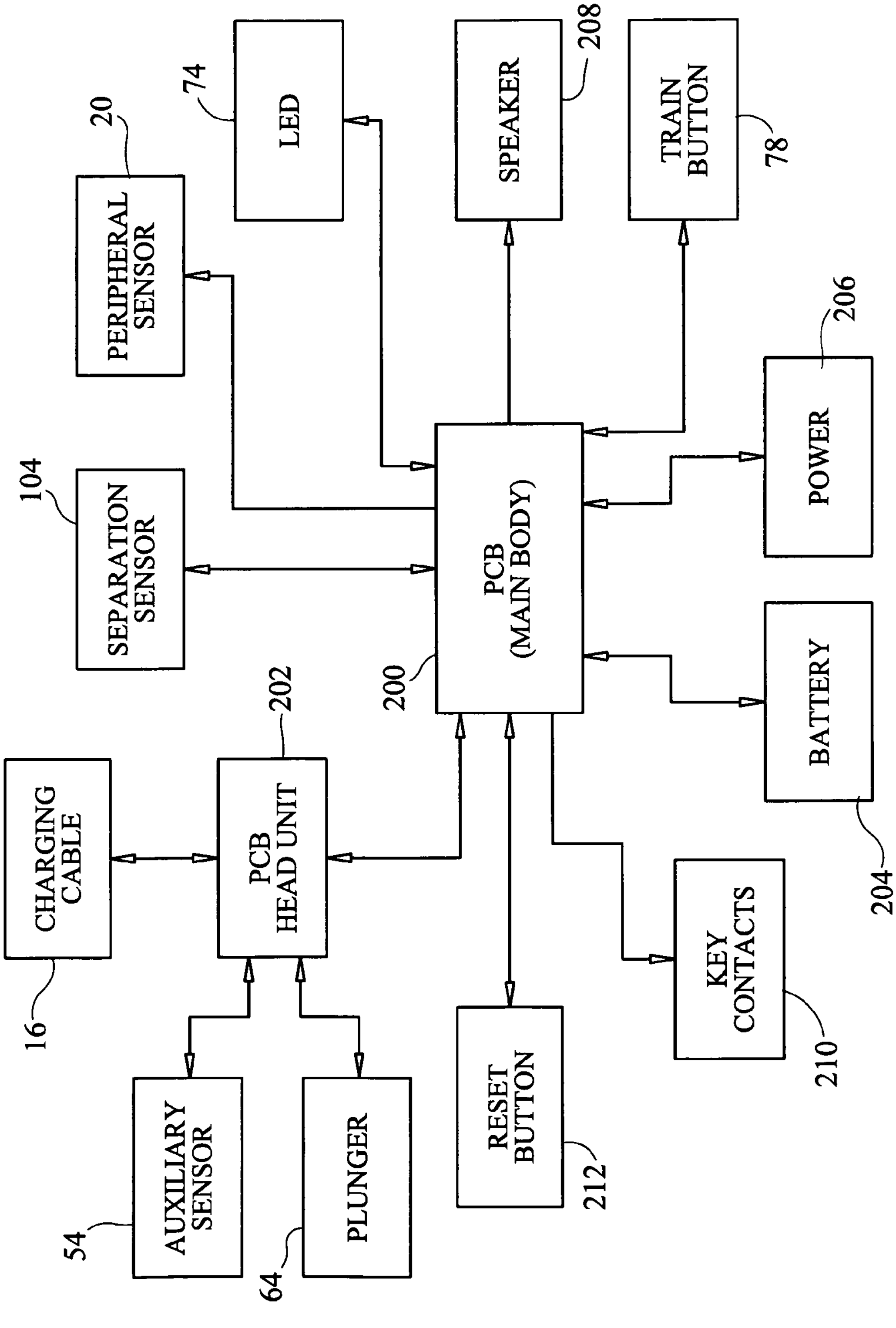
FIG. 16 illustrates a black box diagram of a multi-sensor alarm apparatus and a system for securing articles in an embodiment of the present invention.

The alarm apparatus 2 may be connected to an exterior power source 206 with the power cable 56. Referring now to FIG. 16, the power source 206 may provide power to a printed circuit board 200 (hereinafter "the PCB 200") that may be housed within the main body 36. The PCB 200 may control the primary functions of the alarm apparatus 2 and/or the system 4. The alarm apparatus 2 may have a battery (not shown) within the main body 36 that may operate the alarm apparatus 2 and/or the system 4 when the power source 206 fails and/or becomes disconnected. The present invention should not be deemed as limited to a specific embodiment of the power source 206 and/or the battery. The power source 206 and/or the battery may be any power source and/or battery as known to one having ordinary skill in the art.

As shown in FIG. 4, the key 58 may have a key holder 59 that may surround the key 58. When inserted into the key slot 76, the key holder 59 may deflect the release leaver 102 and may allow the main body 36 to be removed from the base 42. In a preferred embodiment, the key 58 may be, for example, a Maxim Integrated Products, Dallas Semiconductor iButton™. The key 58 may have a computer chip that may be programmed with a unique serial identity. The main body 36 may have key contacts 210 (shown in FIG. 16) that may be located adjacent to the key slot 76 between the main body 36 and the base 42. The key contacts 210 may be in communication with the PCB 200. Together with the key contacts 210, the PCB 200 may read and/or may record the unique serial identity of the computer chip of the key 58 when the key 58 is seated within the key slot 76 and/or adjacent to the key contacts 210. The key 58 may be used to disable, to quiet, to repair, to train and/or to program the alarm apparatus 2 and/or the system 4. Further, the key 58 together with the PCB 200 may be used to program additional unique serial identities of additional keys into the alarm apparatus 2 and/or the system 4. The present invention should not be deemed as limited to a specific embodiment of the key 58 and/or the key contacts 210. The key 58 and/or the key contacts 210 may be any security key and/or key contacts that may be recognized by and/or connected to a printed circuit board as known to one having ordinary skill in the art.

As illustrated in FIG. 4, the alarm apparatus 2 may have an LED 74 situated within the main body 36 adjacent to the front side 38 of the main body 36. The LED 74 may be electrically connected to the PCB 200 and may produce light that may be visible from the front side 38 of the main body 36. Further, the alarm apparatus 2 may have a speaker 208 (shown in FIG. 16) situated within the main body 36. The speaker 208 may be electrically connected to the PCB 200. The PCB 200 may be programmed to activate the LED 74 and/or the speaker 208 during an alarm state when the security of the articles 6, 12 may be breached. Further, the PCB 200 may be programmed to activate the LED 74 and/or the speaker 208 in conjunction with various programming, training and/or activation processes. Further, as illustrated in FIG. 6, the alarm apparatus 2 may have a train button 78 on the back side 40 of the main body 36. The train button 78 may be in communication with the PCB 200 and may be used to program the PCB 200 to activate various components of the alarm apparatus 2 and/or the system 4. In an embodiment, the alarm apparatus 2 may have a reset button 212 (shown in FIG. 16) that may extend from main body 36 between the main body 36 and the base 42. The reset button 212 may be in communication with the PCB 200 and may be used to reset the serial identities of the keys 58 that may be programmed into the PCB 200. The present invention should not be deemed as limited to a specific embodiment of the LED 74, the speaker 208, the train button 78 and/or the reset button 212. The LED 74, the speaker 208, the train button 78 and/or the reset button 212 may be any LED, speaker and/or buttons, respectively, that may be connected to and/or in communication with a printed circuit board as known to one having ordinary skill in the art.

FIG. 16 generally illustrates a black box diagram of the alarm apparatus 2 and/or the system 4. The PCB 200 may be connected to and/or in communication with various components, such as, for example, the reset button 212, the key contacts 210, the battery 204, the power source 206, the train button 78, the speaker 208, the LED 74, the peripheral sensor 20, the separation sensor 104, the PCB 202, the plunger 64, the auxiliary sensor 54 and/or the charging cable 16. The present invention is intended for use with various combinations of the components depending on the article 6 and/or the article 12 being secured, the availability and/or the need for the auxiliary sensor 54, the charging cable 16, the plunger 64 and/or the peripheral sensor 20, and the security requirements of a user of the alarm apparatus 2 and/or the system 4.

For example, the user may require the plunger 64 and head unit 32 with the primary tether cable 14 to secure the article 6. In another embodiment, the user may require the plunger 64, the head unit 32 with the primary tether cable 14, the redundant auxiliary sensor 54 and/or the redundant auxiliary cable 48. In another embodiment, the user may require the plunger 64, the head unit 32 with the primary tether cable 14 and/or the charging cable 16. In another embodiment, the user may require the peripheral sensor 20 and the peripheral tether cable 18. The present invention should not be deemed as limited to a specific combination of the components. The combination of components may be any combination as known to one having ordinary skill in the art.

Figure 17:
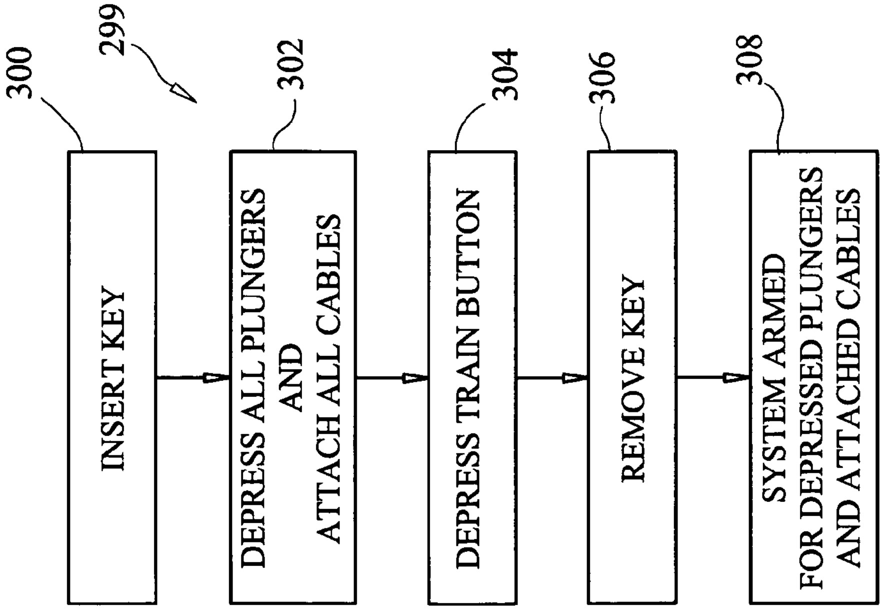
FIG. 17 illustrates a method for training and arming a multi-sensor alarm apparatus and a system for securing articles in an embodiment of the present invention.

As such, the alarm apparatus may be programmed to arm and/or to monitor the integrity of any combination of the components that may be selected by the user for securing the article 6 and/or the article 12. Referring now to FIG. 17, a method 299 for training the alarm apparatus 2 and/or the system 4 for use with the combination of components selected by the user is generally shown. The method shown in FIG. 17 assumes that the user is using a key 58 whose serial identity is known by and/or previously programmed into the PCB 200. Particularly, the method 299 may be initiated by inserting the key holder 59 with the key 58 into the key slot 76 (generally illustrated in FIG. 4 and as herein described above), as shown beginning at step 300. The user may connect all selected sensors (e.g. the head unit 32 with the plunger 64, the redundant auxiliary sensor 54, and/or the peripheral sensor 20) to the articles and may secure all required cables (e.g. the primary tether cable 14, the redundant auxiliary cable 48, the charging cable 16 and/or the peripheral tether cable 18) to the sensors and to the head unit 32 and/or the main body 36, as shown beginning at step 302. The user may then depress the train button 78 as shown at step 304. In an embodiment, the PCB 200 may be programmed to light an LED (not shown) on each active sensor which may confirm to the user which sensors are installed properly. In an embodiment, the PCB 200 may be programmed to activate the LED 74 to blink for a period of time, such as, for example, five seconds during step 304. The user may then remove the key holder 59 with the key 58 from the key slot 76 as shown at step 306. After removal of the key holder 59 with the key 58 from the key slot 76, the PCB 200 may be programmed to arm the alarm apparatus 2 and/or the system 4 for the installed sensors as shown at step 308. If any of the sensors detect a detachment from the article, the PCB 200 may be programmed to enter an alarm state and/or may trigger an audible indicator which may be produced by the speaker 208. Further, the alarm state may trigger a visible indicator, such as, for example, a blinking light, which may be produced by the LED 74 within the main body 36. Further, the LED (not shown) on the sensor that may be tripped may also produce a visible indicator, such as, for example, a blinking light which may convey to a user which sensor has detected the detachment.

Figure 18:
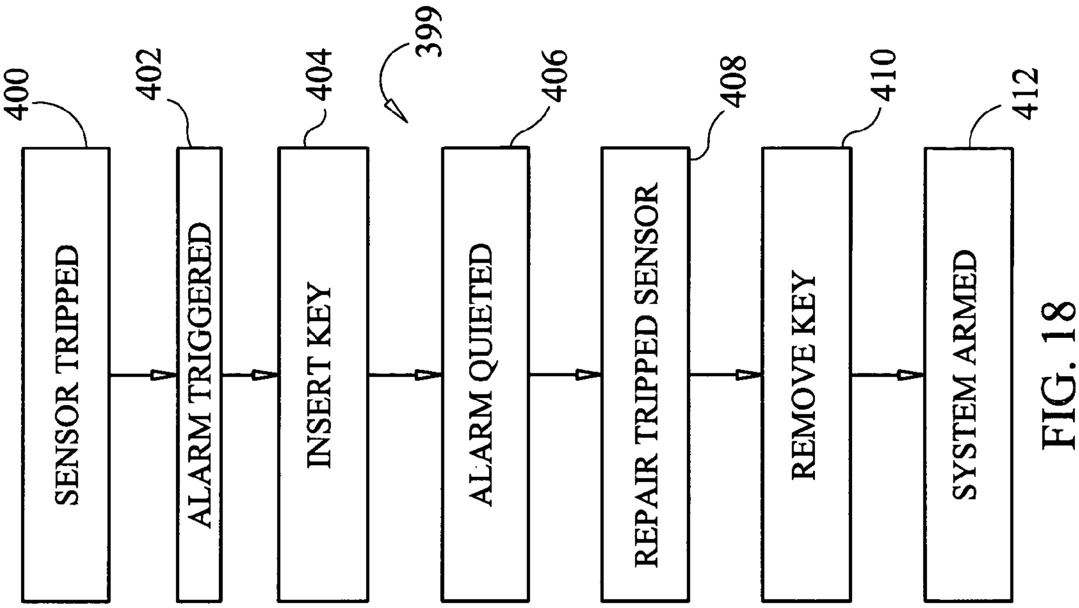
FIG. 18 illustrates a method for dis-arming and re-arming a multi-sensor alarm apparatus and a system for securing articles in an embodiment of the present invention.

Referring now to FIG. 18, a method 399 for quieting and re-arming the alarm apparatus 2 and/or the system 4 is generally shown. The method 399 shown in FIG. 18 assumes that the user is using a key 58 whose serial identity is known by and/or previously programmed into the PCB 200. Particularly, the method begins after a sensor detects a detachment as shown beginning at step 400. After a sensor detects a detachment, the PCB 200 may be programmed to enter the alarm state as shown at FIG. 402. A user may then insert the key holder 59 with the key 58 into the key slot 76 (generally illustrated in FIG. 4 and as herein described above), as shown beginning at step 404. The PCB 200 may be programmed to quiet the alarm and/or to initiates a visible indicator, such as, for example, a blinking light from an LED (not shown) on the sensor that detects the detachment as shown at step 408. The user may easily locate the tripped sensor and may repair and/or re-seat the sensor on the article as shown at step 408. The user may then remove the key holder 59 with the key 58 from the key slot 76 as shown at step 410. Upon removal of the key holder 59 with the key 58 from the key slot 76, the PCB 200 may be programmed to arm the alarm apparatus 2 and/or the system 4 for the installed sensors as shown at step 412.

Figure 19:
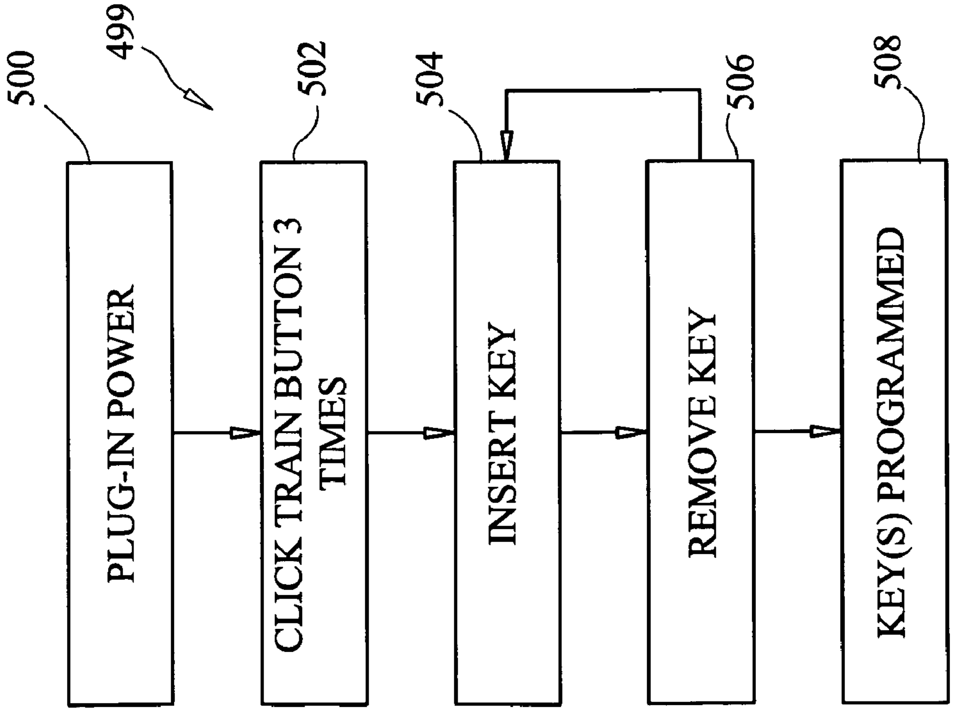
FIG. 19 illustrates a method for programming unknown keys of a multi-sensor alarm apparatus and a system for securing articles with no known keys in an embodiment of the present invention.

Referring now to FIG. 19, a method 499 for programming one or more keys 58 is generally shown. The method 499 shown in FIG. 19 assumes that the PCB 200 is not programmed with the serial identity of any keys and; therefore, at least one key 58 may be programmed to use the alarm apparatus 2 and/or the system 4. Particularly, the method 499 begins with connecting the power source 206 to the PCB 200 and/or by connecting the battery 204 to the PCB 200 as shown beginning at step 500. After the power is connected to the PCB 200, the user may then depress the train button 78 a pre-set number of times, such as, for example, three times, as shown beginning at step 502. The PCB 200 may be programmed to detect the serial identity of the key 58. The user may then insert the key holder 59 with the key 58 into the key slot 76 (generally illustrated in FIG. 4 and as herein described above), as shown beginning at step 504. The PCB 200 may be programmed to detect the key 58 and/or to store the serial identity of the key 58. The key 58 is now known to the alarm apparatus 2 and/or the system 4 and may be used to operate the same as herein described above. The user may then remove the key 58 and the key holder 59 from the slot as shown at step 506.

The PCB 200 may be programmed to provide a pre-set time period, such as, for example, five seconds wherein the user may proceed to insert another key 58 having another serial identity into the key slot 76 as shown at step 504. The PCB 200 may be programmed to activate a visual indicator, such as, for example, a blinking light from the LED 74 during the pre-set time period to indicate to the user that an additional key 58 may be inserted for programming. If no additional key 58 is inserted within the pre-set time period, the PCB 200 may be programmed to close the programming sequence and/or may store the known keys at step 508. It should be understood that the preset number of times may be any number as programmed into the PCB 200 to enter the programming mode. Further, it should be understood that the pre-set time period may be any length of time as programmed into the PCB 200 to insert additional keys 58.

Figure 20:
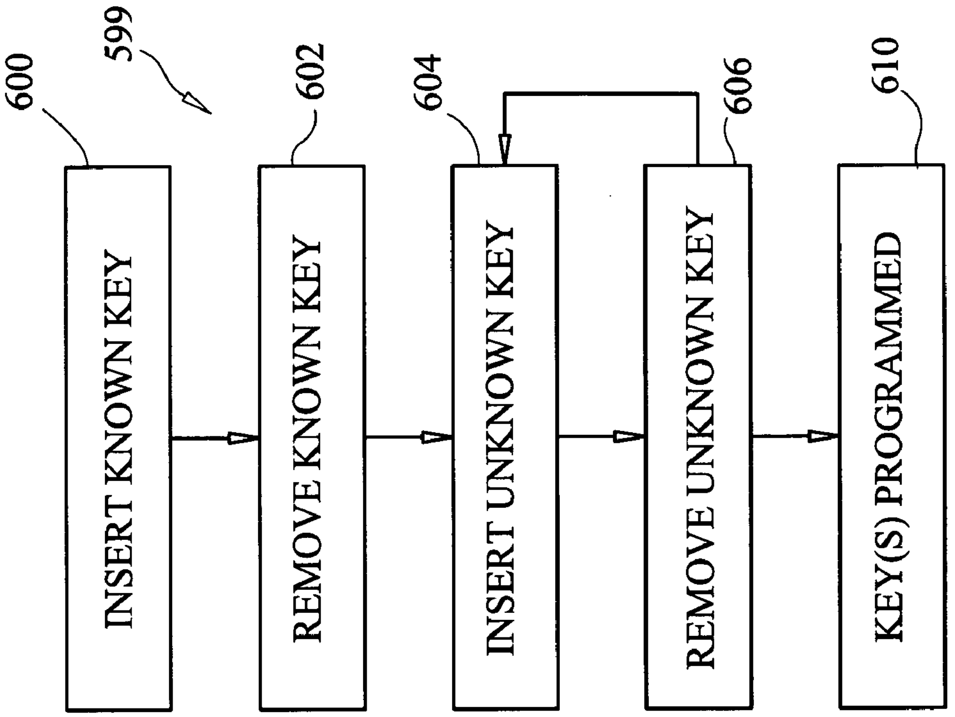
FIG. 20 illustrates a method for programming unknown keys of a multi-sensor alarm apparatus and a system for securing articles with a known key in an embodiment of the present invention.

Referring now to FIG. 20, a method 599 for programming one or more keys 58 is generally shown. The method 599 shown in FIG. 20 assumes that the PCB 200 is programmed with the serial identity of at least the one key 58. Particularly, the user may begin by inserting the key holder 59 with the known key 58 into the key slot 76 (generally illustrated in FIG. 4 and as herein described above), as shown beginning at step 600. The PCB 200 may be programmed with the serial identity of the known key 58. The user may then remove the known key 58 and the key holder 59 from the slot as shown at step 602. The PCB 200 may be programmed to provide a pre-set time period, such as, for example, five seconds wherein the user may proceed to insert an unknown key 58 having a unique serial identity into the key slot 76 as shown at step 604. The PCB 200 may be programmed to activate a visual indicator, such as, for example, a blinking light from the LED 74 during the pre-set time period to indicate to the user that an additional key 58 may be inserted for programming. The user may then insert the unknown key 58 into the key slot 76 as shown at step 604. The PCB 200 may be programmed to store the unique serial identity of the unknown key 58. The user may then remove the key 58 as shown at step 606 and may insert additional unknown keys 58, if desired. If no additional unknown key 58 is inserted within the pre-set time period, the PCB 200 may be programmed to close the programming sequence and/or to store the known keys 58 at step 610. It should be understood that the pre-set time period may be any length of time as programmed into the PCB 200 to insert additional unknown keys 58.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

We claim:

1. An alarm apparatus for securing a plurality of articles to a display with a plurality of sensors wherein each of the plurality of sensors has a plug, the alarm apparatus comprising:

a base having a front side and a back side wherein the back side is positioned opposite to the front side wherein the base has a first end and a second end wherein the second end is positioned opposite to the first end wherein the base has a bottom end in a position adjacent to the front side, the back side, the first end and the second end wherein the front side, the back side, the first end and the second end are integrally formed with the bottom end wherein the front side, the back side, the first end, the second end and the bottom end form a perimeter of the base;

a main body having a front end and a back end wherein the back end is positioned opposite to the front end wherein the main body is sized to sit within the perimeter of the base to form an interior compartment wherein the interior compartment is defined by the front side of the base, the back side of the base, first end of the base, the second end of the base, the bottom end of the base and the main body wherein the main body fastens to the base;

a faceplate integrally formed on the front end of the main body wherein the faceplate forms a pedestal having a surface area sized to display one of the plurality of articles;

a key slot in the front end of the main body sized to provide access to the interior compartment;

a release lever extending from the base within the interior compartment wherein the release lever deflects to unlock the main body from the base; and a plurality of jacks in the main body to receive the plugs wherein the plurality of jacks are accessed from the interior compartment wherein the base prevents removal of the plugs from the plurality of jacks.

2. The alarm apparatus of claim 1 further comprising:

a lens cover sized for attachment to the main body to cover the faceplate wherein the lens cover is transparent; and an insert having indicia wherein the insert is sized for insertion between the lens cover and the faceplate.

3. The alarm apparatus of claim 1 further comprising:

a head unit sized to house one of the plurality of sensors wherein the head unit attaches to one of the plurality of articles wherein the head unit has a convex surface; and a concave surface on the faceplate to receive the convex surface of the head unit.

4. The alarm apparatus of claim 1 further comprising:

a key sized for insertion into the key slot to release the main body from the base.

5. The alarm apparatus of claim 1 further comprising:

a power connection in the main body to provide power to the main body wherein the power connection is accessed from the interior compartment.

6. The alarm apparatus of claim 1 further comprising:

a battery within the main body wherein the battery powers the main body.

7. The alarm apparatus of claim 1 further comprising:

a plunger sensor extending from the main body wherein the plunger sensor detects an attachment of the main body to the base.

8. The alarm apparatus of claim 1 further comprising:

an LED visible from the main body to provide a visual indication of an alarm state.

9. The alarm apparatus of claim 1 further comprising:

a speaker within the main body to provide an audible indication of an alarm state.

* * * * *